April 24, 1962 I. TSU 3,031,400
PREPARATION OF SUPERCONDUCTIVE TIN BY ELECTRODEPOSITION
Filed May 27, 1960
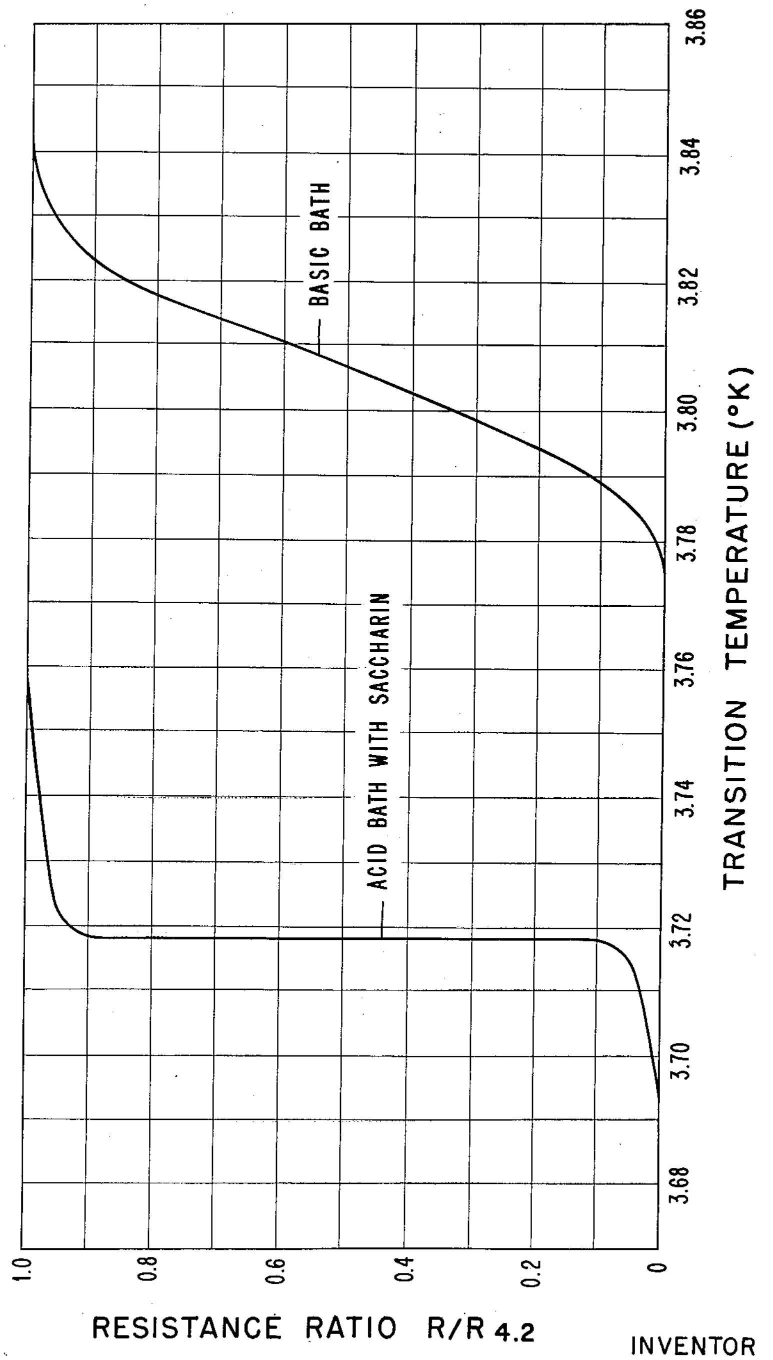
INVENTOR
IGNATIUS TSU
BY Walter Katz
ATTORNEY 3,031,400
Patented Apr. 24, 1962

3,031,400
PREPARATION OF SUPERCONDUCTIVE TIN BY ELECTRODEPOSITION

Ignatius Tsu, Beacon, N.Y., assignor to International Business Machines Corporation, New York, N.Y., a corporation of New York Filed May 27, 1960, Ser. No. 32,366
5 Claims. (Cl. 204—54)

The invention relates to superconductive elements and more particularly to an electroplating method of preparing superconductive tin suitable for use as a cryogenic element in computer circuitry. Furthermore, it relates to a plating bath composition which is capable of producing superconductive tin having advantageous properties for use in cryogenic elements.

The preparation of superconductive tin by a process of vacuum evaporation is well known in the art. The extreme difficulties associated with this method are numerous. In particular the vacuum method suffers the disadvantage of requiring that extensive precautions be taken to exclude oxygen or any other gaseous species from co-depositing in the edges of the deposited metal. On the other hand an advantage of vacuum evaporated superconductive films resides in the fact that the thin film adheres firmly to the substrate member. While it is generally recognized that electroplated films are less costly and easier to prepare, in a variety of shapes, including tubes, it is also known that non-pitted, adherent, electroplated films are difficult to prepare. These effects are particularly exaggerated in thin films. Furthermore, since superconductive films require a very pure metallic deposit for operation in computers, a plating bath has not been considered a very satisfactory source of the metal. One criterion of suitability of use of superconductive films for cryogenic circuits is the temperature at which the metal undergoes a transition from the resistive to the superconductive state. If the transition temperature is close to that of the bulk metal and the transition is sharp then the purity and suitability of the material is established.

While acid tin electroplating baths are known in the art they have not been used extensively due to the fact that in an acid solution the metals have a tendency to strip off the electrodes. Thus a basic bath, such as one in which tin is present at the stannate, is used predominately for electroplating tin.

Accordingly, an object of the present invention is to provide an acid plating bath for preparing pure superconductive films of tin.

A further object is to provide pure superconductive tin films by a process of electrodeposition with properties approaching the bulk metal.

A more specific object of the present invention is to provide firmly adhering, ductile, non-pitted, pure superconductive tin films which have physical characteristics comparable to the bulk material, in particular, exhibiting a sharp transition temperature in the same range as the bulk material.

The foregoing and other objects, features and advantages of the invention, will be apparent from the following more particular description of preferred embodiments of the invention, as illustrated in the accompanying drawings:

In the drawings: The FIGURE shows a plot of resistance ratio versus transition temperature for superconductive films prepared from both acid and basic plating baths.

This invention is based upon a discovery that superconducting tin films suitable for use as cryogenic elements may be prepared from an acid plating bath containing a small amount of saccharin (i.e. benzosulfimide) as an addition agent to prevent the film from stripping off the electrode. Within a certain bath composition the superconductive tin films thus prepared exhibit a sharp resistance versus temperature transition at temperatures comparable to that of bulk tin. It has also been observed that an improved magnetic transition is also obtained. The tin thus produced firmly adheres to the substrate to provide a workable cryogenic element.

In a typical run a metallic tin layer is deposited onto flat plastic substrates which have been flashed with a copper surface, or onto conductive glass. To produce films of 700 A. thickness the plating is carried out for about 30 seconds at a current density of 100 amps. per square foot. Variation in the thickness of the deposit may be conveniently controlled by the plating time. The substrate may be appropriately masked for depositing tin only in certain desired areas of the substrate.

The table presents examples of suitable bath compositions.

| Bath Parameter | Maximum | Preferred | Minimum |
|---|---|---|---|
| $SnSO_4$ g./l. | 180 | 100 | 30 |
| $C_4H_6O_6$ (Tartaric Acid) g./l. | 60 | 30 | 0 |
| Saccharin (i.e. benzosulfimide) g./l. | 3 | 0.8 | 0.4 |
| Sodium Lauryl Sulfate g./l. | 0.5 | 0.1 | 0 |
| $Sn^{++}$ g./l. | 99 | 55 | 16.5 |
| $C_4H_4O_6^{=}$ g./l. | 59.7 | 29.8 | 0 |
| pH ($H_2SO_4$) g./l. | 1.5 | 1.2 | 0.9 |
| T (° C.) | 90 | 60 | 25 |
| Current Density (Amperes per square foot) | 300 | 100 | 40 |

The nature of the addition agent used in the plating bath plays an important role in the production of ductile, non-pitted, firmly adhering tin films. The effect is particularly pronounced with films in the order of 700 A. thick. Saccharin has been found to be much preferred over other addition agents commonly used in acid tin baths, as for example, animal glue, which produces a high degree of pitting in the deposit.

While the tin is shown in the form of the sulfate, any anion may be used provided it does not cause precipitation in the bath.

Tartaric acid is preferred as the complexing agent in the sulfate bath; however, citric acid, glycolic acid or any of the known complexing agents for tin may be used as well.

The presence of a surface active agent, such as sodium lauryl sulfate, is desirable in the bath to effect a reduction in the surface tension at the cathode-solution interface.

Referring now to the figure in which is plotted $R/R_{4.2}$, namely, the ratio of the resistance of the film at a given temperature to the resistance of the film at 4.2° K., versus temperature, it is seen that superconductive tin films deposited from an acid plating bath exhibit a sharp transition temperature at about the same temperature of bulk tin (3.72° K.), while tin produced from a basic bath exhibit an S-shaped transition curve at higher temperature than bulk tin. While these differences are not completely understood, it is believed that the structure of the deposit influences the properties of the resultant films.

Superconductive tin films produced using the plating bath composition of the present invention are also particularly advantageous in that the films adhere strongly to the substrate and are stable over a long period of time without change of physical properties. Furthermore, the thickness of the metallic deposit is observed to be uniform throughout the entire length of the film.

While the invention has been particularly shown and described with reference to preferred embodiments thereof, it will be understood by those skilled in the art that various changes in form and details may be made therein without departing from the spirit and scope of the invention.

What is claimed is:

1. A plating bath for electrodepositing, non-pitted, adherent superconductive films of tin having a sharp transition temperature at 3.72° K. comprising an aqueous acid conductive solution of stannous sulfate between 0.4–3 g./l. of saccharin as an addition agent, 0–60 g./l. of a complexing agent and 0–0.5 g./l. of a surface active agent, the bath being maintained at a pH between 0.9 and 1.5.

2. A plating bath for electrodepositing non-pitted, adherent superconductive films of tin having a sharp transition temperature at 3.72° K. comprising between 30 and 180 grams per liter of $SnSO_4$, 10 and 60 g./l. of tartaric acid, 0.4 g./l. and 3 g./l. of saccharin and 0.1 and 0.5 g./l. of sodium lauryl sulfate, the bath being maintained at a pH between 0.9 and 1.5.

3. The bath as claimed in claim 2 containing 100 g./l. $SnSO_4$, 30 g./l. tartaric acid, 0.8 g./l. saccharin, 0.1 g./l. sodium lauryl sulfate and the pH being 1.2.

4. A method of making non-pitted, adherent superconductive films of tin having a sharp transition temperature at 3.72° K. which comprises electrolyzing an aqueous acid conductive solution of stannous sulfate in the presence of a quantity of saccharin as an addition agent at a current density between 40 and 300 amps. per square foot, said solution being maintained at a pH between 0.9 and 1.5 and a temperature between 25° C. and 90 C.

5. A method of making non-pitted, adherent superconductive films of tin of 700 A. thickness having a sharp transition temperature at 3.72° K. which comprises electrolyzing from a plating bath of 100 g./l. $SnSO_4$, 30 g./l. tartaric acid, 0.8 g./l. saccharin and 0.1 g./l. sodium lauryl sulfate at pH of 1.2, a bath temperature of 60° C. and a current density of 100 amps. per square foot during a period of 30 seconds.

References Cited in the file of this patent

UNITED STATES PATENTS

| | | |
|---|---|---|
| 694,658 | Meurant | Mar. 4, 1902 |
| 2,457,152 | Hoffman | Dec. 28, 1948 |

OTHER REFERENCES

Kern: Transactions Amer. Electrochem. Soc., vol. 38 (1920), pages 146–147.

Discher et al.: Journal Electrochem. Soc., vol. 102 (1955), pages 387–389.